US006676814B1

United States Patent
Stollenwerk et al.

(10) Patent No.: US 6,676,814 B1
(45) Date of Patent: Jan. 13, 2004

(54) SUBSTRATE COATED WITH AN MGO LAYER

(75) Inventors: Johannes Stollenwerk, Rösrath (DE); Christoph Daube, Alzenau (DE); Achim Gürke, Aschaffenburg (DE)

(73) Assignee: Unaxis Trading AG, Balzers (LI)

( * ) Notice: Subject to any disclaimer, the term of this patent is extended or adjusted under 35 U.S.C. 154(b) by 0 days.

(21) Appl. No.: 09/687,845

(22) Filed: Oct. 13, 2000

Related U.S. Application Data

(60) Division of application No. 09/203,918, filed on Dec. 2, 1998, now Pat. No. 6,150,030, which is a continuation-in-part of application No. 08/985,880, filed on Dec. 5, 1997.

(30) Foreign Application Priority Data

Nov. 20, 1997 (EP) ............................................. 97120354
Nov. 10, 1998 (EP) ............................................. 98121350

(51) Int. Cl.⁷ ............................................. C23C 14/34
(52) U.S. Cl. ............................ 204/192.22; 204/192.15
(58) Field of Search ...................... 204/192.22, 192.15, 204/298.06, 298.12, 298.23, 298.07, 298.13, 298.16

(56) References Cited

U.S. PATENT DOCUMENTS 6,337,001 B1 * 1/2002 Haag et al. ............... 204/192.2

FOREIGN PATENT DOCUMENTS

EP 0803587 A1 * 10/1997 ........... C23C/14/34

OTHER PUBLICATIONS

Kaneko, Y. "Preparation of MgO Thin Films by RF Magnetron Sputtering", Japanese Journal of Applied Physics, vol. 30, No. 5, May 1991, pp. 1091–1092.*

English translation of EP 803587.*

* cited by examiner

Primary Examiner—Steven H. VerSteeg
(74) Attorney, Agent, or Firm—Notaro & Michalos P.C.

(57) ABSTRACT

A method for manufacturing a display panel substrate has the steps of flowing a working gas along and out of a slit defined between two sputtering targets of Mg and toward the substrate thereby selecting the purity of the Mg material of the targets to be at least 99% and thereby blowing sputtered-off material out of the slit and toward the substrate. Introduction, in an area between the slit and the substrate, of a reactive gas containing oxygen, follows, and reacting the sputtered-off material with the reactive gas results in depositing on the substrate, an MgO layer. The method also includes setting the temperature of the substrate during the coating process.

80 Claims, 10 Drawing Sheets

SUBSTRATE COATED WITH AN MGO LAYER

Figure 1:
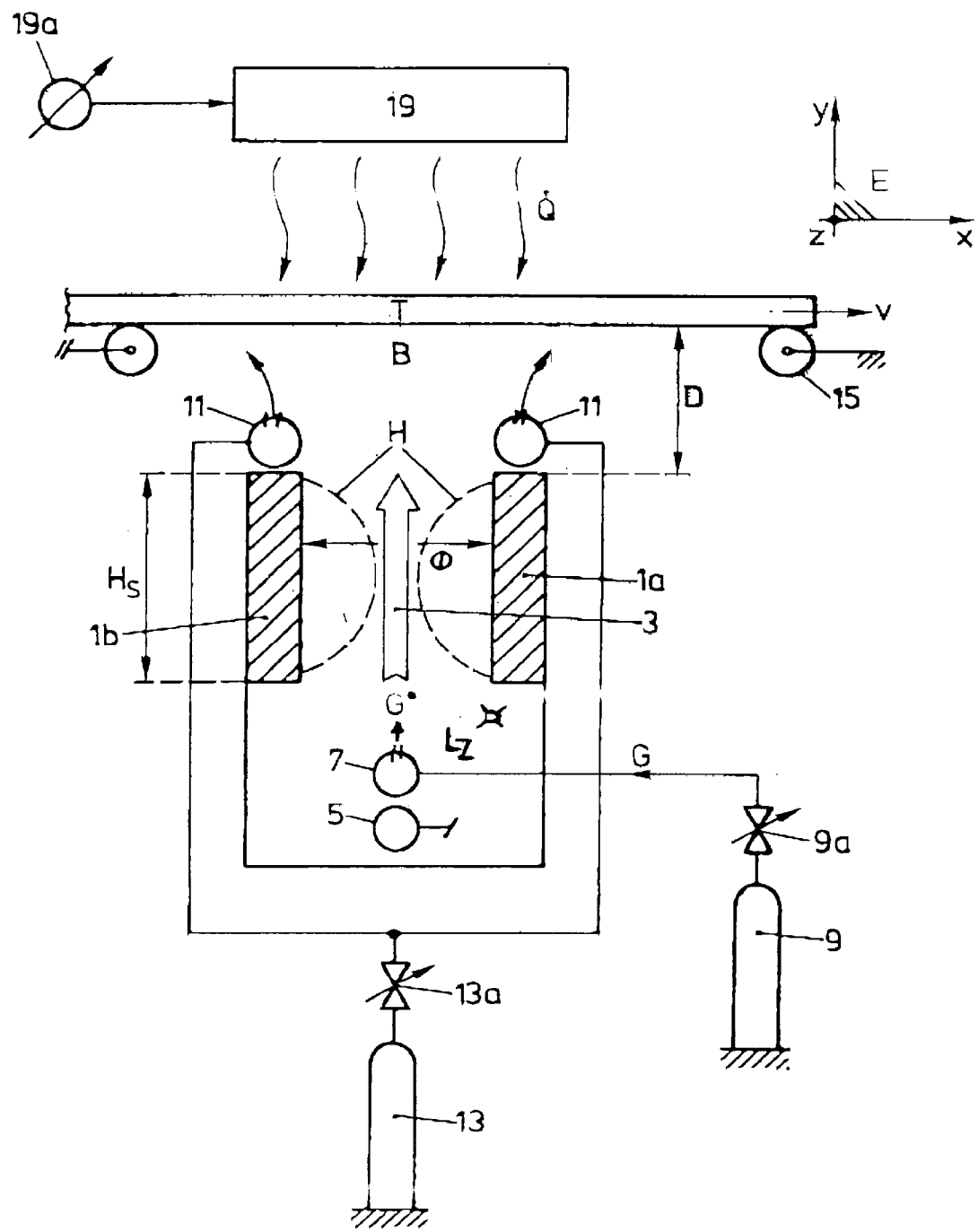

This is a division of application Ser. No. 09/203,918 filed Dec. 2, 1998, and now U.S. Pat. No. 6,150,030 issued Nov. 21, 2000, which was a continuation-in-part of application Ser. No. 08/985,880, filed Dec. 5, 1997, which, in turn claims priority on European patent applications 97120354.2 filed Nov. 20, 1997 and 98121350.7 filed Nov. 10, 1997.

The present invention is directed to a substrate which is coated with at least one layer of Magnesium-Oxide, i.e. of MgO, and which has an extent of at least 100 mm×100 mm. Further, the present invention is directed to a method for manufacturing a coated substrate and especially for manufacturing a substrate which is coated with at least one MgO-layer and which has an extent of at least 100 mm×100 mm.

Further, the present invention is directed to a coating apparatus for MgO coating planar substrates with an extent of at least 100 mm to 100 mm.

PRIOR ART

It is known to coat relatively large surface substrates, as especially substrates for Plasma Display Panels (PDP), by means of electron beam evaporation with high quality MgO-layers. The high quality is e.g. guaranteed by the fact that the density of the deposited layer material, compared with the density $\rho$ of MgO-bulk material, which is $\rho=3.58$ g/cm3, is very high, namely between 85% and 95% of the bulk material density $\rho$.

Definitions

In the following, the term "Θ-2Θ-method" is used.

This method is known from F. Kohlrausch, Praktische Physik, vol. 2, 23rd edition, p. 753, B. G. Teubner, Stuttgart 1985, and from Leonid V. Azaroff, "Elements of X-Ray Crystallography", McGraw-Hill Book Company, New York, St. Louis, San Francisco, Toronto, London, Sydney, pp. 366–367.

Attention is further drawn to "Elements of X-Ray Diffraction", 2nd edition, B. D. Cullity, Addison-Wesley Publishing Company, Inc., Reading, Mass., pp. 188–189.

The mentioned method resides on the "Bragg method" and is based on rotation of the crystal by an angle Θ coupled to a rotation of a detector by an angle of 2Θ and is thus named "Θ-2Θ"-method.

If, in the present application, we talk of a "peak at (xyz)" we refer to a peak in the measuring diagram of the Θ-2Θ-method which is present according to a (xyz) orientation of the crystals as is customary in the art of crystallography.

If we refer to a "predominant peak" we refer to such a peak in the Θ-2Θ-method measuring diagram which is higher than all other peaks in that diagram.

If we refer to the presence of a single peak in said diagram, it is automatically understood that peaks of higher order are present too. Thus, if we speak of a single peak at (111), we automatically understand that there is a second order peak present at (222).

The coating material which is deposited by electron beam evaporation has the significant drawback that it shows no predominant peak when examined by the Θ-2Θ-method.

SUMMARY OF THE INVENTION

The present invention proposes a substrate which is coated with at least one Mgo-layer and which has an extent of at least 100 mm×100 mm wherein the layer has a predominant peak in the resulting diagram of the Θ-2Θ-method. Especially if such an inventive substrate is a PDP-substrate, it is often very advantageous that the layer of this substrate has such predominant peak at (111) or has even exclusively a peak at (111). Manufacturing of such substrates is not possible by means of electron beam evaporation.

Further, and instead of a predominant peak at (111), a predominant peak may be realized at another, (xyz), angular location or, additionally to a predominant peak at (111), further peaks at other (xyz) angular locations may be present. Especially such a peak may be present at (200) and/or at (220) as predominant peak or as additional peaks.

In a preferred embodiment of the inventive substrate, the MgO-layer has an index of refraction n for which there is valid $$1.5 \leq n \leq 1.8,$$

for light in a spectral range of at least 400 nm to 800 nm or even preferably in a range of 350 nm to 820 nm.

In a further preferred embodiment, the index of refraction n in the said spectral range is $$1.59 \leq n \leq 1.75.$$

In a further preferred embodiment of the present invention the inventive substrate has a homogeneous surface roughness of the layer which is preferably between 0.5 nm RMS and 18 nm RMS, especially for a layer thickness of between 200 nm and 800 nm and measured by means of AFM (Atomic Force Microscopy).

Although the inventive substrate has, based on the inventively provided predominant peak, advantages compared with such substrates realized customarily, the inventive substrate has further and preferably a density of the layer material which is at least 80% or even at least 90% of the density $\rho$ of stoichiometric MgO-bulk material. As was mentioned above, the density of MgO-bulk material is $\rho=3.58$ g/cm3.

In a preferred embodiment, the inventive substrate has a layer wherein the MgO-material is stoichiometric.

It is further inventively proposed a method for producing a substrate, thereby preferably a substrate with at least one MgO-layer, and which has an extent of 100 mm×100 mm, which layer shows at least one predominant peak in the measuring course of the Θ-2Θ-method.

Such a method comprises the steps of flowing a working gas through at least one slit defined between two sputter-targets made of Mg towards a substrate which substrate is distant from an end-area of the slit, thereby selecting the purity of the Mg-target material to be at least 99%, and of introducing oxygen into the area between said end area of said slit and the substrate and further predetermining the substrate temperature prevailing during the coating process.

Thereby it becomes possible to realize the inventive substrate with a high coating rate, due to the inventively proposed reactive sputter coating and further with high degree of target material exploitation. Thus, it becomes possible to manufacture the inventive substrates industrially and in a very economical manner. As a working gas preferably Argon is used, and at least as a part of a reactive gas, oxygen. It has been recognized that by introducing a reactive gas substantially composed of oxygen and hydrogen there result highly desired further advantages. Thereby, the hydrogen fraction which is brought into the process atmosphere may be fed thereto, possibly together with the working gas, but especially preferred, together with the reactive gas, i.e. together with oxygen. Possibly the two fractions of reactive gas, oxygen and hydrogen, are premixed. Hydrogen is thereby introduced with a fraction of 0% (thus making use of pure oxygen as reactive gas) to 50%, related to the total reactive gas amount, whereby preferably hydrogen is inlet with a fraction of 0% to 10% of the total reactive gas amount. The advantages which are gained by making use of hydrogen are on one hand that the surface roughness of the MgO layer is influenced, and on the other hand the crystal structure thereof:

By introducing hydrogen into the process atmosphere it becomes possible to adjust the surface roughness of the layer. So it becomes possible to e.g. reduce thereby the surface roughness e.g. by an amount of 50%, for instance from 10 nm RMS to 5 nm RMS due to inletting hydrogen gas into the process atmosphere.

If e.g. in a pure oxygen reactive gas atmosphere there results a crystal structure with a predominant peak at (111), there results e.g. when inletting 0.5% hydrogen, still referred to the total reactive gas amount, a crystal structure of the MgO layer with a predominant peak at (220). When inletting 5% hydrogen a predominant peak results at (200).

Thus, it becomes possible to adjust the surface roughness as well as the crystal structure respectively of the MgO layer by means of controlled inlet of hydrogen gas to the process atmosphere.

The mentioned large areal substrates may be produced at relatively low costs and at high throughputs industrially.

An inventive and preferred coating arrangement for preferably performing the inventive method is proposed which comprises:

- two Mg-targets mutually defining a slit and made of Mg-material with a purity of at least 99%;
- at a first end area of the slit an anode arrangement and a gas feed arrangement connected to a gas tank arrangement containing a working gas, the gas nozzles of which being so directed that the gas is inlet not directly between the targets but towards the end thereof so as to result in turbulences;
- a substrate carrier and conveyor arrangement with which a planar substrate is moved over and past said slit, distant from a second slit end area which is opposite to said first slit end area;
- a further gas feed arrangement acting into the space between said second slit end area and said substrate carrier and conveyor arrangement, which further gas feed arrangement being connected to a gas tank arrangement for a reactive gas containing oxygen.

SHORT DESCRIPTION OF THE FIGURES

The invention is further described by way of examples and with the help of figures.

Figure 2:
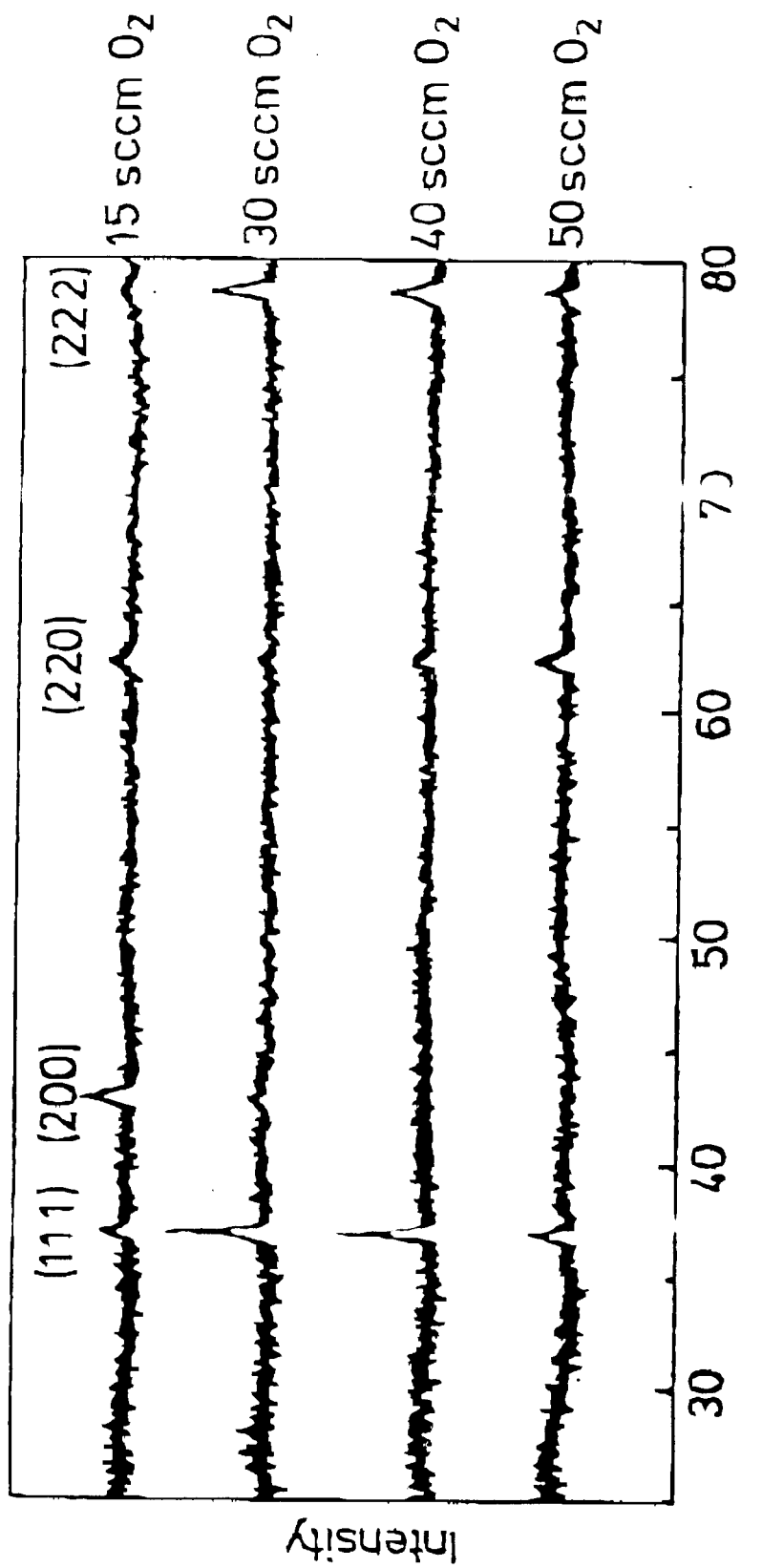
Figure 3:
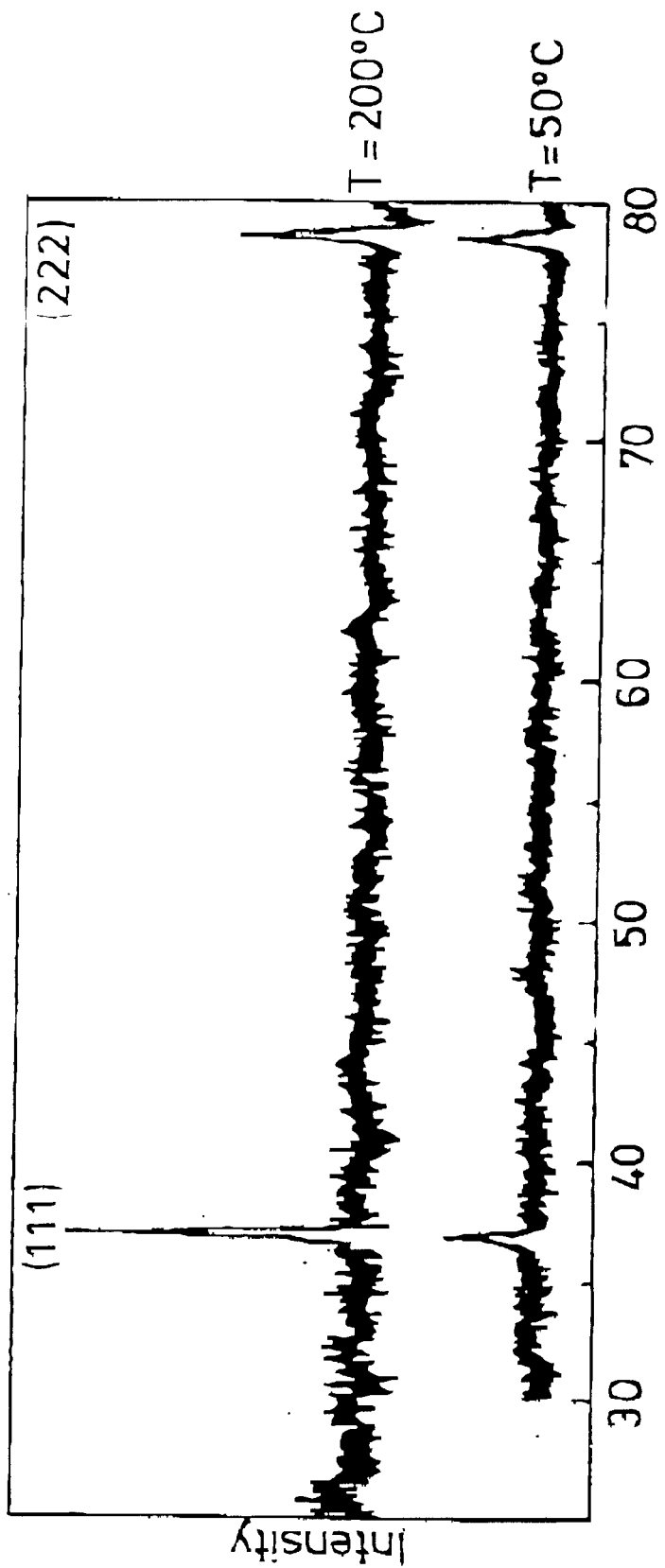
Figure 4:
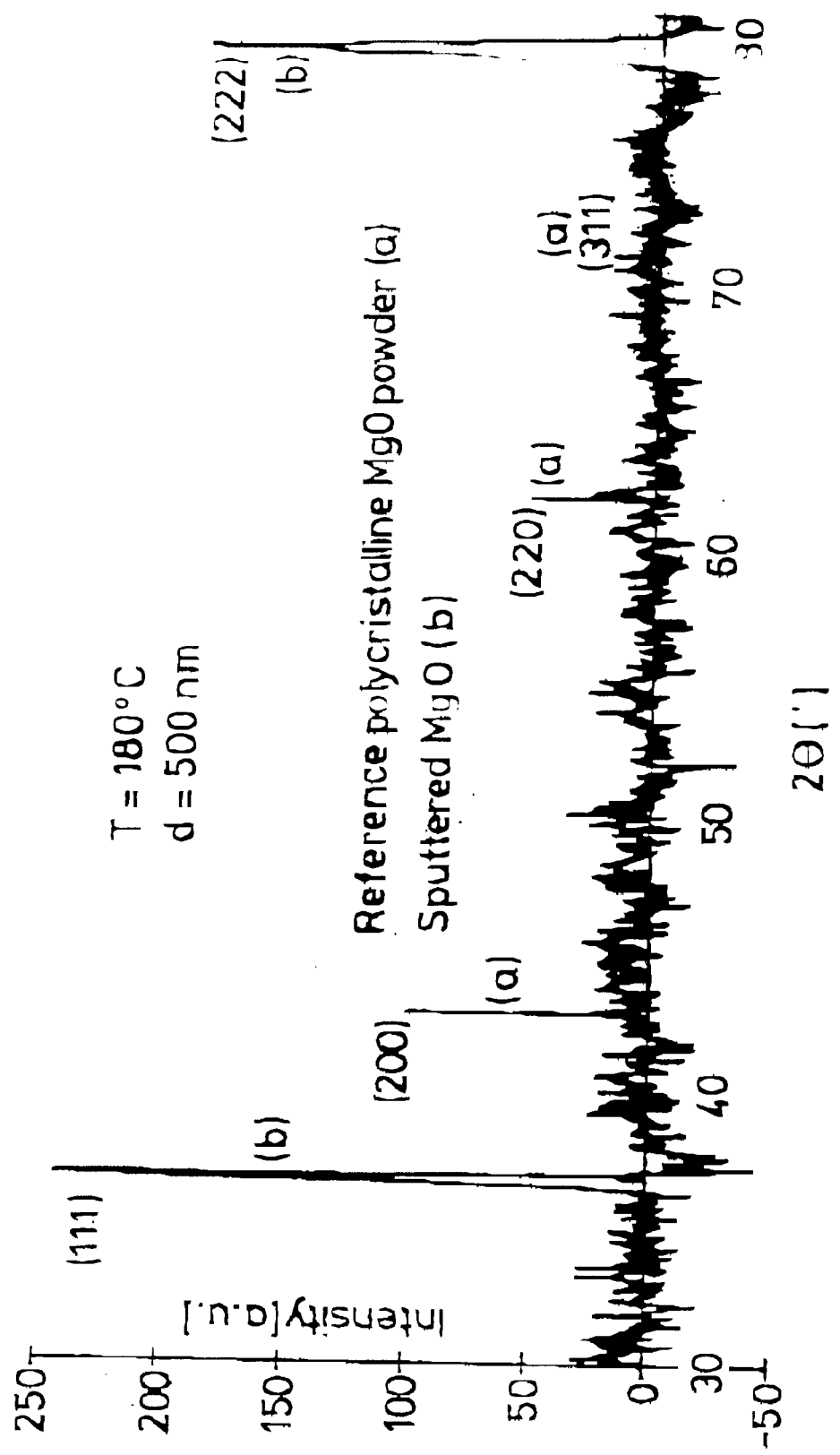
Figure 5:
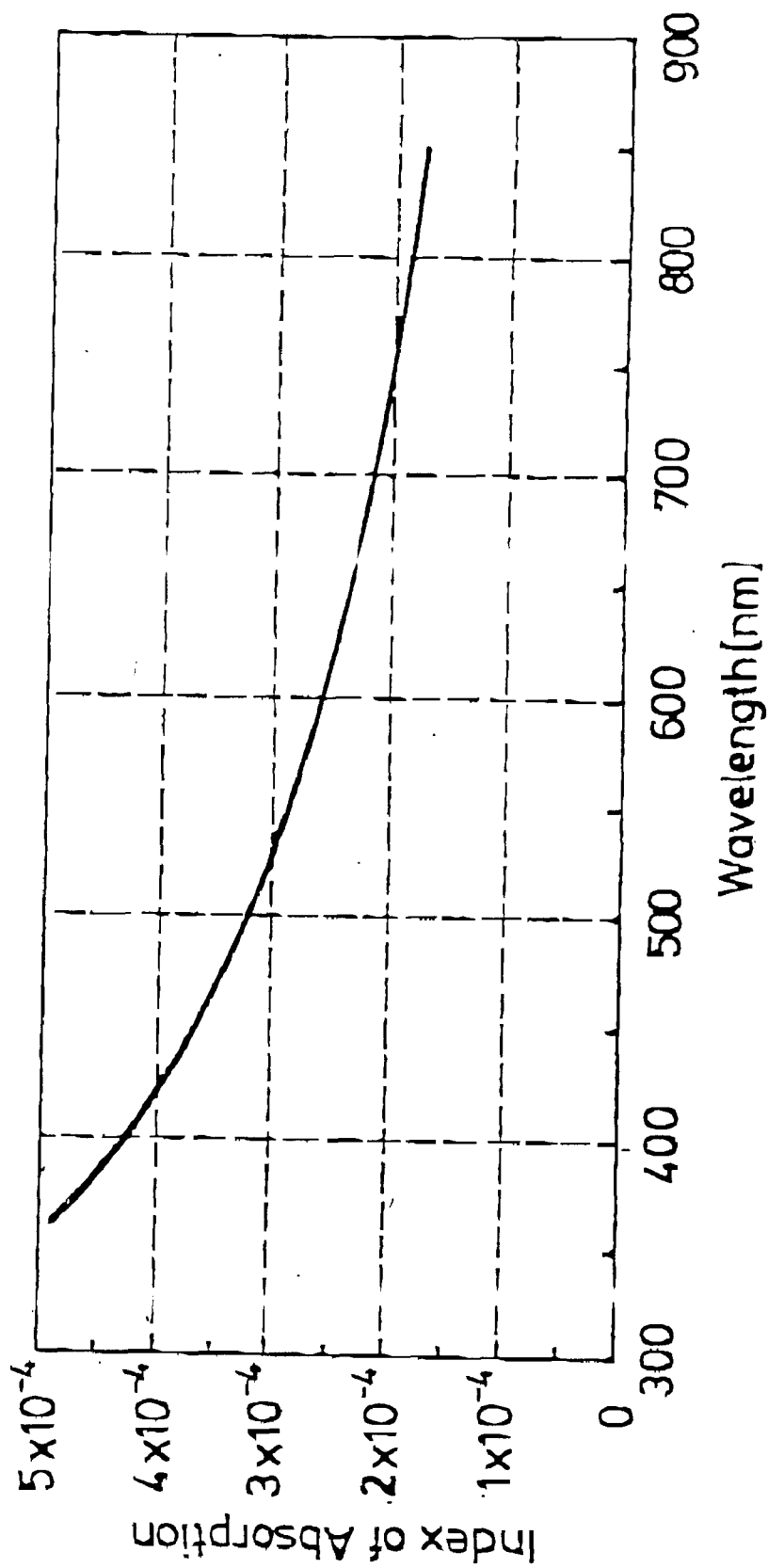
Figure 6:
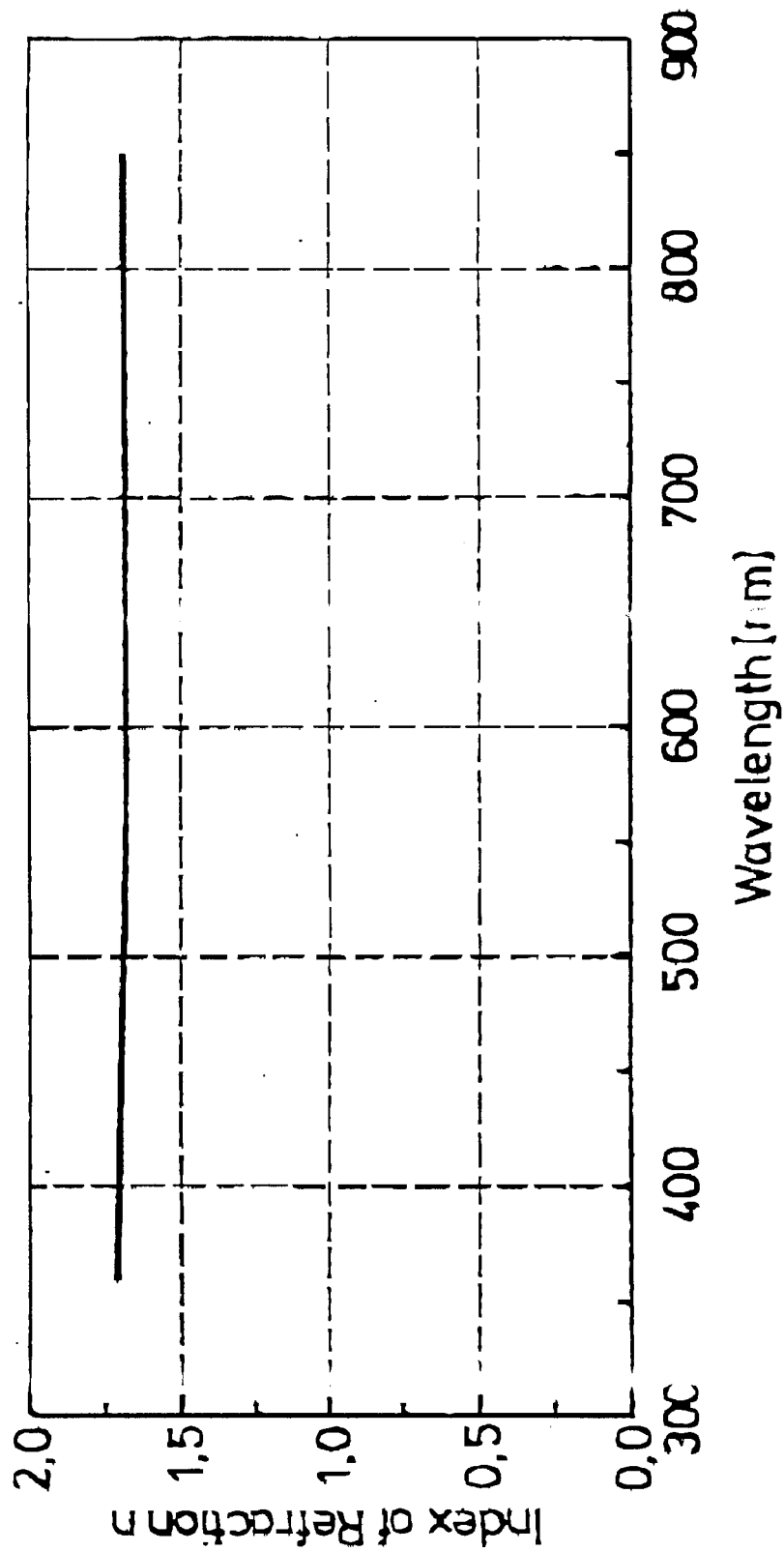
Figure 7:
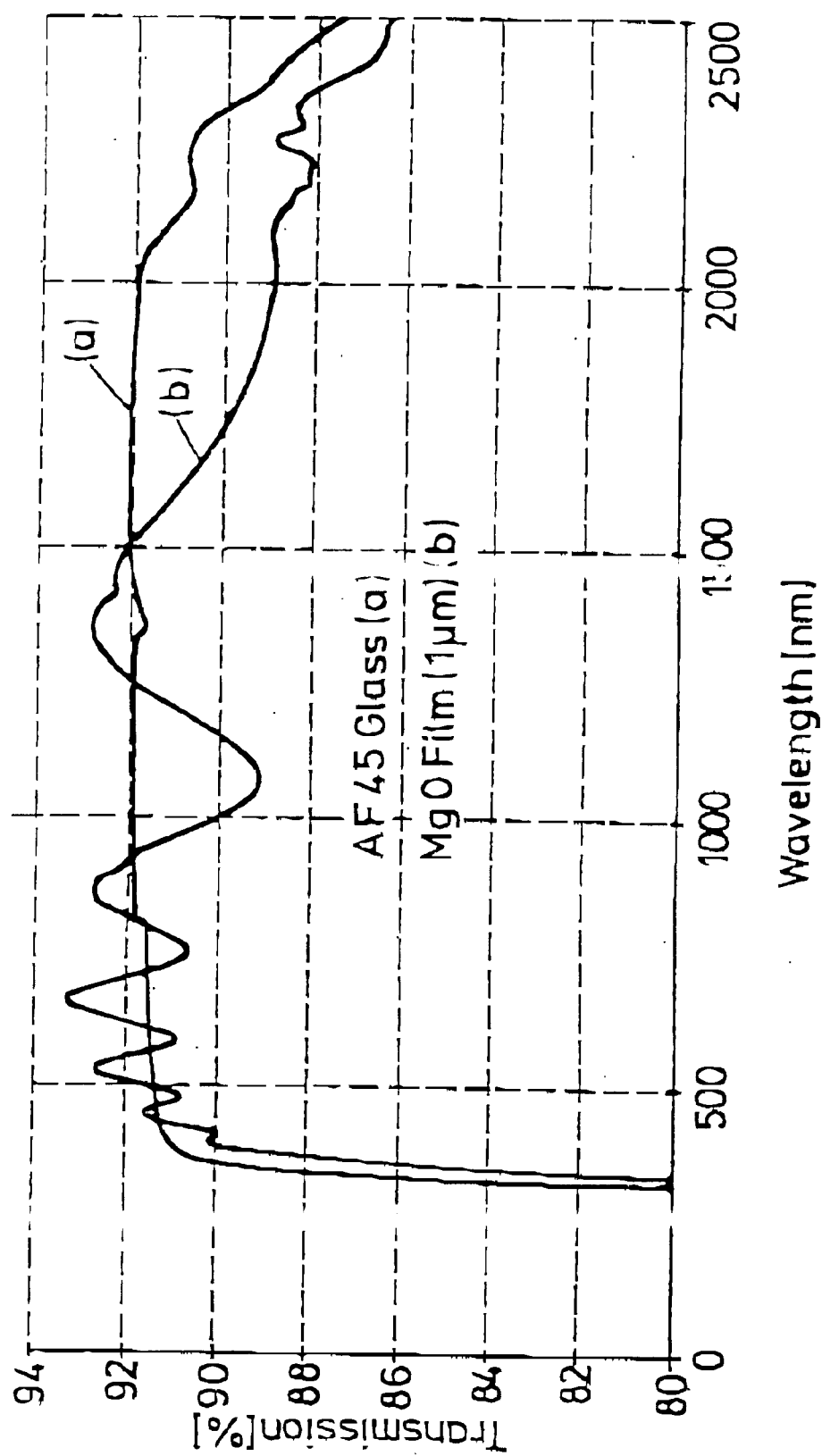
Figure 8:
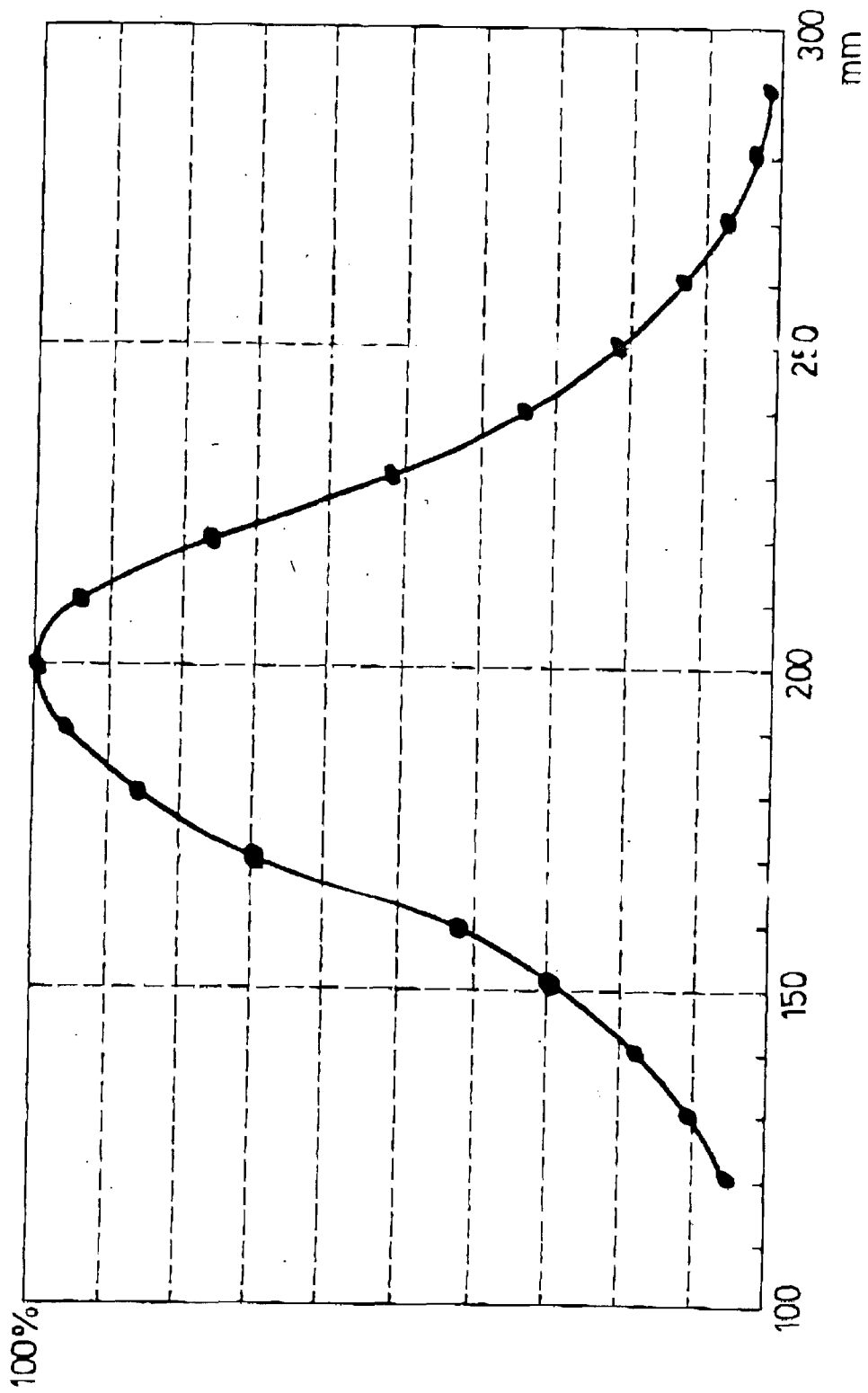
Figure 9:
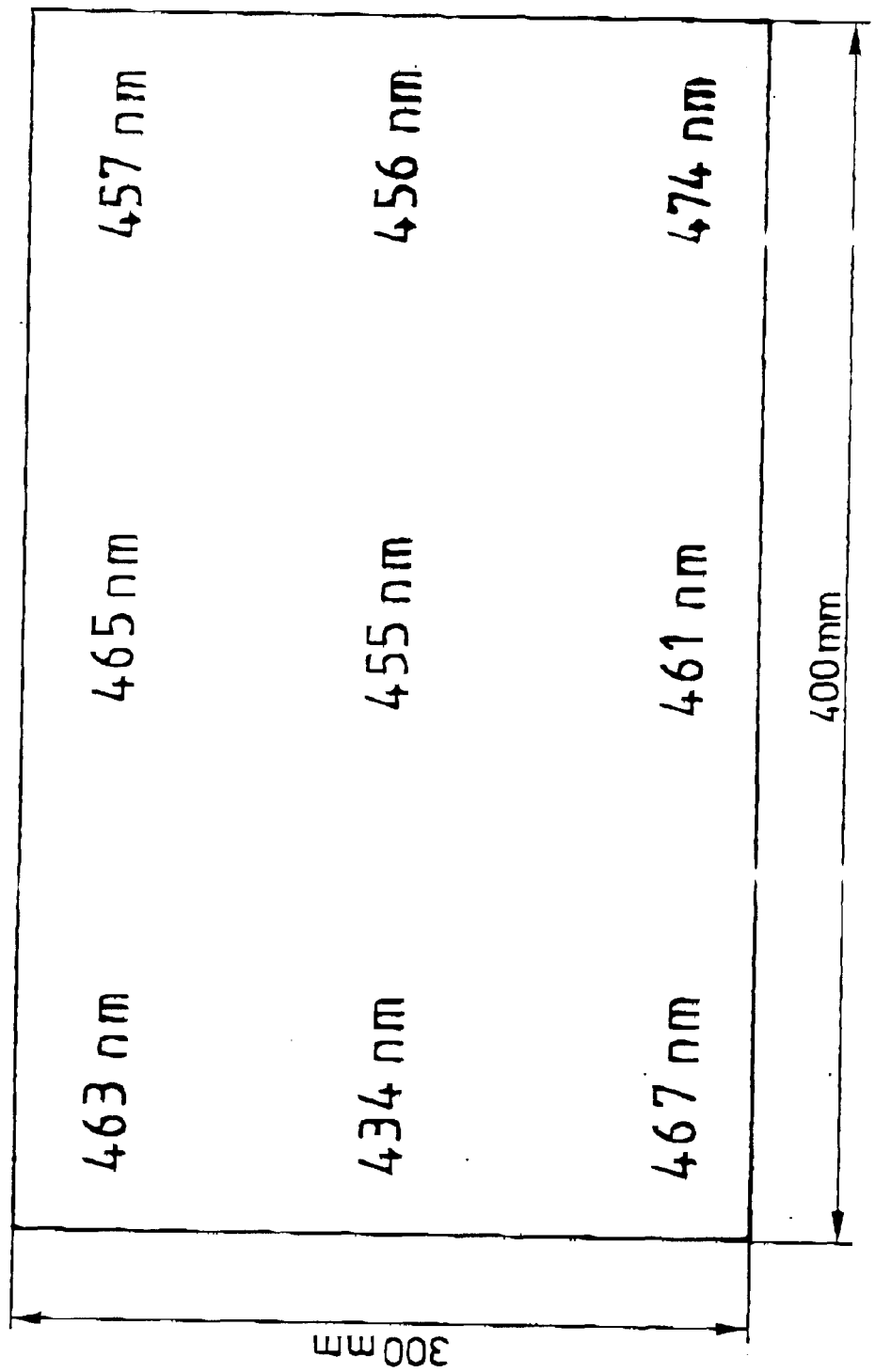
Figure 10:
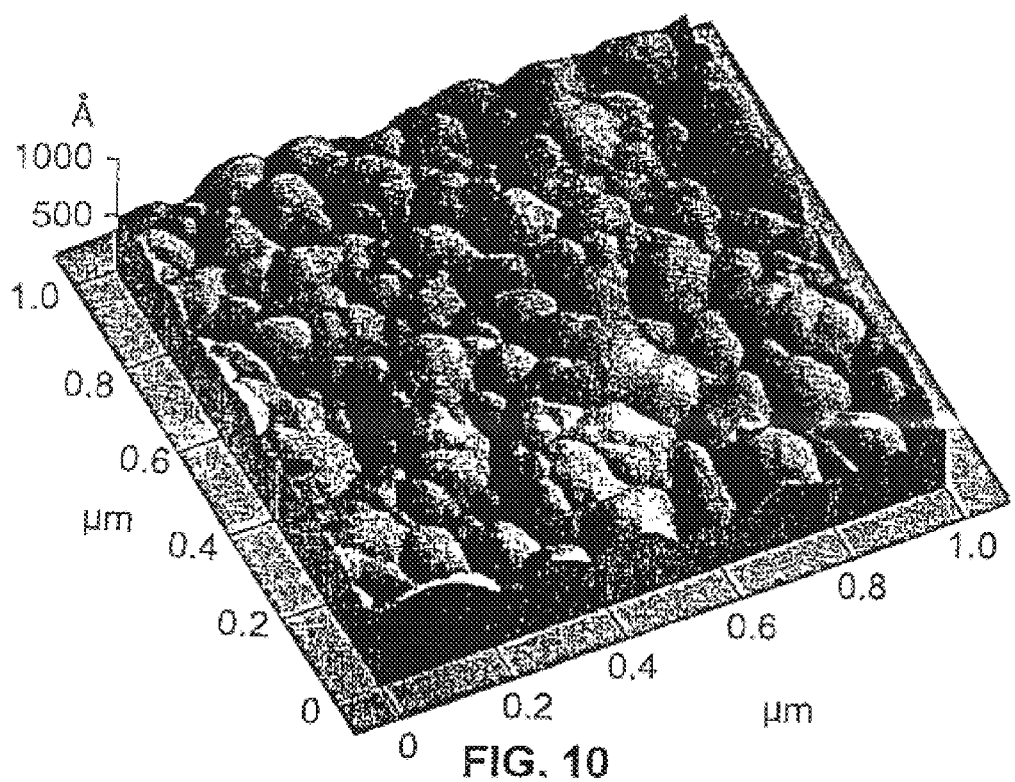

These figures show:

FIG. 1 schematically an inventive apparatus for performing the inventive manufacturing process and for realizing the inventive substrate;

FIG. 2 the Θ-2Θ-method diagram with predominant peaks at (111) and (200) respectively of an inventive substrate produced according to the inventive method and preferably thereby with the inventive apparatus and for a varied oxygen flow;

FIG. 3 in a representation in analogy to that of FIG. 2, the setting of the peaks by varying the substrate temperature T prevailing during the inventive coating;

FIG. 4 in a representation in analogy to FIG. 2, the peak at an inventive substrate (b) and at a polycrystalline MgO-powder (a), latter for comparison;

FIG. 5 the absorption coefficient as a function of wavelength of the impinging light of an inventive substrate, manufactured according to the inventive method and, preferably, with an inventive apparatus;

FIG. 6 the index of refraction n as a function of wavelength of the impinging light of an inventive substrate according to FIG. 5;

FIG. 7 the spectral transmission in percent for an AF 45 glass (a), for comparison, and of an inventive substrate which comprises AF 45 glass as carrier substrate;

FIG. 8 along a plane E as shown in FIG. 1, the distribution of deposited layer material, whereby the substrate is kept stationary with respect to the coating source and indicated in percent of the maximum deposition thickness along the substrate;

FIG. 9 on an inventive PDP-substrate, the distribution of MgO-coating thickness;

FIG. 10 at an inventive substrate, coated at a substrate temperature T=200° C., the surface roughness measured by means of Atomic Force Microscopy (AFM).

DETAILED DESCRIPTION OF THE FIGURES

In FIG. 1 there is schematically shown a coating apparatus which is most apt to perform the inventive method and to manufacture the inventive substrate. With respect to further apparatus, which is at least as suited as that shown in FIG. 1, we refer to the EP-0 803 587 and to its U.S. counterpart, copending U.S. application Ser. No. 08/895,451 which is incorporated in this description by reference. The apparatus according to FIG. 1 and that as disclosed in the EP-0 803 587 and, respectively, in the U.S. application Ser. No. 08/895,451 are referred to as "gas flow sputter source" apparatus.

Essential at such a gas flow sputter source is at least one pair of targets, 1a and 1b, which mutually define a slit 3 which is, considered in Z-direction of FIG. 1, extended. Slit 3 is, according to FIG. 1, open on both sides considered in Z-direction or is, according to the EP-0 803 587 and its U.S. counterpart, U.S. application Ser. No. 08/895,451. The extent of the slit considered in Z-direction may be e.g. 1600 mm in both forms of realization. The targets are preferably (not shown) operated by DC generators, whereby also AC or DC with superimposed AC or pulsating DC operation is possible. In one end area of the slit 3 there is provided an anode arrangement 5 as well as a gas feed arrangement 7 which extend along slit 3. The gas feed arrangement 7 is connected via an adjusting member 9a to a working gas tank arrangement 9 which preferably contains Argon.

At that end area of the slit which is opposed to the gas feed arrangement 7 there is provided a further gas feed arrangement 11. This further gas feed arrangement, as again schematically shown, is connected with a gas tank 13 via an adjusting member 13a, which gas tank 13 contains oxygen. The gas feed arrangement 11 is so construed and its gas nozzles are so directed that the gas does not directly flow between the targets, but into the end area of the targets so as to result in turbulences. The gas tank arrangement 13 contains either, at least to a predominant amount, only oxygen or oxygen and hydrogen. In the last mentioned case tanks for oxygen and hydrogen are provided interconnected with respective flow control members or the reactive gas mixture oxygen/hydrogen is premixed in a tank arrangement. The hydrogen amount which is possibly inlet into the process atmosphere is inlet thereto preferably through the reactive gas feed arrangement 11 and/or may be inlet possibly together with the working gas via the gas feed arrangement 7.

Above the end area of the slit which is provided with the oxygen gas feed arrangement 11, there is provided a substrate carrier and conveyor arrangement, as schematically shown at 15, for a planar substrate 17 with an extent of at least 100 mm×100 mm. By means of that carrier and conveyor arrangement 15, a substrate 17 is conveyed perpendicularly to the gas flow direction G of working gas through slit 3. Thereby, the substrate is moved distant from that end area of the slit which comprises the reactive gas feed arrangement 11. The relative movement of the substrate 17 with respect to slit 3 is preferably linear and preferably constant and continuous.

At the arrangement according to FIG. 1, which has, as was mentioned, a laterally both sided open slit 3, preferably the geometric conditions and the operating parameters are selected as described in the above mentioned EP-0 803 587 and its counterpart, U.S. application Ser. No. 08/895 451:

total pressure within the coating area B: 0.1 to 10 mbar;
  partial pressure reactive gas: up to 10% of the total pressure in the coating area B;
  reactive gas: $O_2$ or $O_2$ and $H_2$. In latter case 0% to 50% $H_2$ relative to reactive gas amount, preferably 0% to 10%.
  output flow of working gas G, preferably of Argon, out of the slit opening into the coating area B:
    This flow is selected within the Knudsen or viscous range. There is valid:
    Knudsen range:

$10^{-2}$ mbar·cm $\leq p \cdot \Phi \leq 0.6$ mbar·cm;

viscous range:

0.6 mbar·cm $< p \cdot \Phi$, wherein p stands for the total pressure in slit 3 and $\Phi$ stands for the width of slit 3.
Preferably this gas flow is selected in the Knudsen range. Further, there is preferably valid:

10 sccm/cm² $\leq F \leq$ 200 sccm/cm², wherein F stands for the flow of working gas per surface area of the slit opening. Peferably there is thereby valid:

20 sccm/cm² $\leq F \leq$ 50 sccm/².

Width of the slit, $\Phi$, i.e. mutual distance of the targets 1a, 1b:

5 mm $\leq \Phi \leq$ 40 mm, thereby preferably $\Phi \leq$ 25 mm, and especially preferred 8 mm $\leq \Phi \leq$ 20 mm.

Depth of the slit (target extent) $H_s$ in direction G of FIG. 1:

1 cm $\leq H_s \leq$ 20 cm, slit height $L_z$: e.g. 1600 mm.

If, similar to a magnetron, tunnel shaped magnetic fields H are realized over the sputtering surfaces of the targets 1a and 1b, then preferably so that, measured parallel to the sputtering surfaces of the targets 1a and 1b and in the middle of the slit 3, there is valid:

150 Gauss $\leq H \leq$ 1200 Gauss, thereby preferably $H \geq$ 300 Gauss, thereby especially preferred 300 Gauss $\leq H \leq$ 800 Gauss.

With the help of a heating and/or cooling arrangement 19, which is adjustable in an open loop controlled or in a negative feedback controlled manner by means of an adjusting member 19a, the substrate temperature T in the area B is set.

A coating apparatus as schematically shown in FIG. 1 was dimensioned and operated as follows:

target material 1a, 1b: Mg3N5, purity 99.95%;
  target discharge voltage with respect to anode 5 on ground potential: 310V;
  discharge current: 27A;
  power density per sputtering surface unit and at planar, yet unsputtered sputtering surfaces: 15W/cm²;
  working gas: Ar with a flow of 8000 sccm;
  reactive gas: $O_2$, variable flow;
  total pressure in the area B: 0.4 mbar;
  substrate temperature: 200° C., variable;
  substrate surface area: 300×400 cm²;
  dynamic deposition rate: 30–50 nm.m/min;
  substrate-to-slit end distant D: 50 mm;
  moving speed of substrate over slit end v: 0.7 m/min.

In FIG. 2 the measuring diagram of the $\Phi$-2$\Phi$-method of the MgO-layer at an inventively coated PDP-glass substrate of AF 45 glass is shown. At the arrangement according to FIG. 1, the oxygen flow was varied by means of the adjusting member 13a. As is shown in FIG. 2, by means of adjusting the flow of oxygen, the height and the angular position of the resulting peak may be adjusted. For a PDP-substrate it was desired to provide exclusively a peak at (111) which was reached at an oxygen flow of 30 sccm to 40 sccm. As may be seen, the second order peak is present at (222).

It may further be seen that by adjusting the oxygen gas flow at the inventive method, the angular position and the height of the resulting peaks may be adjusted, whereby different angular positions, as e.g. at (200) and/or (220) may be set.

In FIG. 3 there is shown that at the inventive production method according to FIG. 1 or at a gas flow sputter source in general, another process parameter which influences angular positions and height of the resulting peaks is the substrate temperature T prevailing during the coating process. Preferably both these parameters, i.e. oxygen flow according to FIG. 2 and substrate temperature T, are exploited for adjusting angular position and height of the resulting peaks as desired.

In FIG. 4 there is shown the measuring diagram (b) of the $\Phi$-2$\Phi$-method at an inventively coated substrate, coated with a 500 nm thick Mgo-layer which was deposited at a temperature T=180° C. The peaks (a) at (200), (220) and (311) are peaks resulting from measuring a polycrystalline MgO-powder and are introduced for comparison.

In FIG. 5 the variation of the extinction coefficient as a function of wavelength of impinging light is shown at the inventively manufactured inventive substrate with the deposited MgO-layer.

With well-known and, as was explained, considerably less economic deposition of high quality MgO-layers on substrates by means of electron beam evaporation, indices of refraction n are realized close to a desired value of 1.7. As may be seen from FIG. 6 at the inventively coated inventive substrate, too, the values of the index of refraction vary between 1.5 and 1.8, preferably between 1.59 and 1.75. This is valid over a spectral range of at least 400 nm to 800 nm and, according to FIG. 6, even for a range between 350 nm and 820 nm.

In FIG. 7 there is shown in percent the transmission of uncoated AF 45 glass (a) and (b) of an inventive substrate with AF 45 glass coated with a 1 µm thick MgO-layer.

FIG. 8 shows, looking back on the arrangement of FIG. 1, the coating rate distribution along the x-direction within the plane E when the substrate is kept stationary over the slit 3. As was mentioned, the distance between substrate and end area of the slit, D, is 50 mm.

In FIG. 9 there is shown the layer thickness distribution at an inventive PDP-substrate with an extent of 300 mm×400 mm. It may be seen therefrom that the layer thickness distribution is considerably better than ±10% with respect to a layer thickness average value, and this in spite of the large extent of the substrate.

In FIG. 10 there is finally shown the surface roughness as monitored with AFM at an inventive substrate which was coated at 200° C. with the MgO-layer of a thickness of 500 nm.

At the inventive substrate, especially as realized according to the inventive method, the surface roughness may be varied in a large range, i.e. between 0.5 nm RMS and 18 nm RMS, especially for layer thicknesses of between 200 nm and 800 nm, and as measured by AFM and especially by adjusting the coating temperature T.

By means of the inventive substrate, and especially the inventive PDP-substrate, there is provided a substrate with a predominant peak especially at (111) of the MgO-layer which further holds a high density. Such inventive substrate may be produced in a most economic manner which is most suited for industrial production. With the inventive method of manufacturing, very high dynamic deposition rates are reached, far above 30 nm.m/min which adds to economic production, additionally to the fact that by the inventive method the target material may be exploited to an extent of over 70%;.

It has to be pointed out that, by means of electron beam evaporation, the material being evaporated may only be exploited to an extent of about 10% Although up to the present moment we have not made corresponding experiments, it is largely believed that, by means of using gas flow sputter sources as described in the EP-0 803 587 and its U.S. counterpart, according to U.S. application Ser. No. 08/895,451 even further increased deposition rates might be realizable, especially if operated with magnetron-type magnetic fields.

Further, it was shown by means of Electron Probe Micro Analysis (EPMA) that the inventively deposited Mgo-layers have no working gas content, i.e. no Argon content. Due to the adjustability of the surface roughness and of the predominant peak, it is possible to optimize the surface area per surface unity of coated substrate for an inventive PDP-substrate, which is very desirable so as to reach high secondary electron emission coefficients. Thereby, it seems that a predominant peak at (111) is optimal. As may be seen from comparing FIG. 3, T=200° C., and FIG. 10, there apparently results at a (111)-peak a high surface roughness of about 0.5 nm RMS.

As was mentioned it is possible to introduce instead of pure oxygen as a reactive gas into the process atmosphere preferably up to 50%, especially preferred up to 10% of the reactive gas amount as hydrogen gas. By addition of hydrogen gas it becomes possible, with the further process parameters kept constant, to control the resulting surface roughness of the MgO layer and its crystal structure respectively in the sense of the predominant peaks appearing thereat. If, the remaining process parameters kept constant, hydrogen gas is introduced in the process atmosphere as a part of the reactive gas, it becomes possible to e.g. reduce the surface roughness e.g. by an amount of 50%, so e.g. from 10 nm RMS (without hydrogen gas) to 5 nm RMS.

Further, it becomes possible by means of inletting hydrogen gas to control the crystal structure of the resulting MgO layer in the sense of the predominant peaks appearing. If at a predetermined process with oxygen there occurs a predominant peak at (111), and then one e.g. adds 2.5% hydrogen with respect to the total amount of reactive gas in the process atmosphere, there results a predominant peak at (220), when introducing 5% hydrogen gas at (200). Thus, it is possible by means of controlled inlet of hydrogen gas into the reactive gas atmosphere to control surface roughness and crystal structure respectively of the MgO layer.

What is claimed is:

1. A method for manufacturing a display panel substrate comprising the steps of:

flowing a working gas along and out of a slit defined between two sputtering targets of Mg and towards said substrate and selecting the purity of the Mg material of said targets to be at least 99% and thereby blowing sputtered-off material out of said slit and towards said substrate;

introducing in an area between said slit and said substrate a reactive gas containing oxygen and reacting said sputtered-off material with said reactive gas, thereby depositing on said substrate an MgO layer;

setting the temperature of said substrate prevailing during said coating; and depositing said MgO with a density of at least 80% of the density of stoichiometric MgO bulk material, which latter is ρ=3.58 g/cm3.

2. The method of claim 1, wherein said substrate is a substrate of a plasma display panel.

3. The method of claim 1, further comprising the step of providing the possibility of introducing into said reactive gas hydrogen and introducing hydrogen with an amount of 0% to 50% into said reactive gas with respect to the total amount of reactive gas introduced.

4. The method of claim 3, further comprising the step of introducing said hydrogen into said reactive gas with an amount of 0% to 10% with respect to the total amount of reactive gas introduced.

5. The method of claim 1, further comprising the step of providing the possibility of introducing hydrogen gas into said reactive gas and controlling the surface roughness of said MgO layer by controlling the amount of hydrogen gas introduced into said reactive gas.

6. The method of claim 1, further comprising the step of providing the possibility of introducing hydrogen gas into said reactive gas and controlling the crystal structure of the MgO layer by controlling the amount of hydrogen gas introduced into said reactive gas.

7. The method of claim 1, further comprising the step of depositing said MgO layer with a density being at least 90% of the density of stoichiometric MgO bulk material, which is ρ=3.58 g/cm3.

8. The method of claim 1, further comprising the step of depositing said MgO layer with a predominant peak at (200) and/or at (220) and/or at (111), in a θ-2θ-method measuring diagram.

9. The method of claim 1, further comprising the step of depositing said MgO with a predominant peak at (111) in a θ-2θ-method measuring diagram.

10. The method of claim 9, wherein said peak is the only predominant peak.

11. The method of claim 10, further comprising the step of depositing said MgO layer with an index of refraction n for a spectral range of light of at least 400 nm to 800 nm, which is $1.5 \leq n \leq 1.8$.

12. The method of claim 1, further comprising the step of depositing said MgO layer with an index of refraction n for a spectral range of light of at least 400 nm to 800 nm which is: $1.59 \leq n \leq 1.75$.

13. The method of claim 12, wherein said range is at least 350 nm to 820 nm.

14. The method of claim 1, further comprising the step of depositing said MgO layer with a thickness of between 200 nm and 800 nm.

15. The method of claim 1, further comprising the step of depositing said MgO layer with a surface roughness which is homogeneously distributed along said substrate and which is in the range of 0.5 nm RMS to 18 nm RMS, measured by means of an atomic force microscope.

16. The method of claim 1, further comprising the step of depositing said MgO layer comprising stoichiometric MgO.

17. The method of claim 1, further comprising the step of adjusting at least one of an angular position and of an extent of peaks at a resulting diagram of a θ-2θ-method by adjusting at least one of the amount of reactive gas introduced per time unit, and of said substrate temperature.

18. The method of claim 1, further comprising the step of selecting a static deposition rate $r_s$ of said MgO layer to be at least 5 nm/sec.

19. The method of claim 18, further comprising the step of selecting said static deposition rate to be at least 10 nm/sec.

20. The method of claim 1, further comprising the step of moving said substrate distant and along said slit during said deposition.

21. The method of claim 20, further comprising the step of selecting said moving to be linearly and with a constant speed.

22. The method of claim 20, further comprising the step of selecting a dynamic deposition rate of a least 30 nm*m/min.

23. The method of claim 22, thereby selecting said dynamic deposition rate to be at least 52 nm*m/min.

24. The method of claim 1, further comprising the step of adding to said reactive gas hydrogen and premixing said oxygen and hydrogen in a tank arrangement, thereby feeding said reactive gas from said tank arrangement.

25. The method of claim 1, further comprising the step of selecting total pressure adjacent said substrate to be:
0.1 to 10 mbar.

26. The method of claim 1, further comprising the step of selecting the partial pressure of said reactive gas adjacent to said substrate to be up to 10% of the total pressure.

27. The method of claim 1, further comprising the step of selecting the flow of working gas through said slit to be within a Knudsen or viscose range.

28. The method of claim 1, further comprising the step of selecting the flow F of working gas per surface area of said slit opening out and towards said substrate to be:
10 sccm/cm2 $\leq$ F $\leq$ 200 sccm/cm2.

29. The method of claim 1, further comprising the step of selecting the width of said slit at its end pointing towards said substrate, φ, to be: 5 mm $\leq$ φ $\leq$ 40 mm.

30. The method of claim 1, further comprising the step of selecting the depth of said slit $H_s$ to be: 1 cm $\leq H_s \leq$ 20 cm.

31. The method of claim 1, further comprising the step of coating substrates of at least an extent of 100 mm×100 mm.

32. The method of claim 1, further comprising the step of coating substrates with in extent of 300 mm×400 mm.

33. The method of claim 32, further comprising the step of coating said substrates with a thickness distribution of at least ±10% with respect to a layer thickness average value.

34. The method of claim 1, further comprising the step of selecting said temperature to be 200° C.

35. The method of claim 1, further comprising the step of exploiting said targets to at least 70%.

36. The method of claim 1, further comprising the step of performing said sputtering by magnetron sputtering.

37. The method of claim 36, further comprising the step of applying a magnetic field H to said targets, so that in the middle of the said slit: 150 Gauss $\leq$ H $\leq$ 1200 Gauss.

38. The method of claim 1, wherein said temperature is open looped or negative feedback controlled.

39. A method for manufacturing a display panel substrate comprising the steps of:
flowing a working gas along and out of a slit defined between two sputtering targets of Mg and towards said substrate and selecting the purity of the Mg material of said targets to be at least 99% and thereby blowing sputtered-off material out of said slit and towards said substrate;
introducing in an area between said slit and said substrate a reactive gas containing oxygen and reacting said sputtered-off material with said reactive gas, thereby depositing on said substrate an MgO layer;
setting the temperature of said substrate prevailing during said coating; and
depositing said MgO with a predominant peak at (111) in the measuring diagram of the θ-2θ-method, said peak being the only predominant peak.

40. The method of claim 39, wherein said substrate is a substrate of a plasma display panel.

41. The method of claim 39, further comprising the step of providing the possibility of introducing into said reactive gas hydrogen and introducing hydrogen with an amount of 0% to 50% into said reactive gas with respect to the total amount of reactive gas introduced.

42. The method of claim 41, further comprising the step of introducing said hydrogen into said reactive gas with an amount of 0% to 10% with respect to the total amount of reactive gas introduced.

43. The method of claim 39, further comprising the step of providing the possibility of introducing hydrogen gas into said reactive gas and controlling the surface roughness of said MgO layer by controlling the amount of hydrogen gas introduced into said reactive gas.

44. The method of claim 39, further comprising the step of providing the possibility of introducing hydrogen gas into said reactive gas and controlling the crystal structure of the MgO layer by controlling the amount of hydrogen gas introduced into said reactive gas.

45. The method of claim 39, further comprising the step of depositing said MgO layer with a density being at least 90% of the density of stoichiometric MgO bulk material, which is ρ=3.58 g/cm3.

46. The method of claim 39, further comprising the step of depositing said MgO layer with a predominant peak at (200) and/or at (220) and/or at (111), in a θ-2θ-method measuring diagram.

47. The method of claim 39, further comprising the step of depositing said MgO layer with an index of refraction n for a spectral range of light of at least 400 nm to 800 nm, which is 1.5≦n≦1.8.

48. The method of claim 39, further comprising the step of depositing said MgO layer with an index of refraction n for a spectral range of light of at least 400 nm to 800 nm which is:

1.59≦n≦1.75.

49. The method of claim 48, wherein said range is at least 350 nm to 820 nm.

50. The method of claim 39, further comprising the step of depositing said Mgo layer with a thickness of between 200 nm and 800 nm.

51. The method of claim 39, further comprising the step of depositing said MgO layer with a surface roughness which is homogeneously distributed along said substrate and which is in the range of 0.5 nm RMS to 18 nm RMS, measured by means of an atomic force microscope.

52. The method of claim 39, further comprising the step of depositing said MgO layer comprising stoichiometric MgO.

53. The method of claim 39, further comprising the step of adjusting at least one of an angular position and of an extent of peaks at a resulting diagram of a θ-2θ-method by adjusting at least one of the amount of reactive gas introduced per time unit, and of said substrate temperature.

54. The method of claim 39, further comprising the step of selecting a static deposition rate $r_s$ of said MgO layer to be at least 5 nm/sec.

55. The method of claim 54, further comprising the step of selecting said static deposition rate to be at least 10 nm/sec.

56. The method of claim 39, further comprising the step of moving said substrate distant and along said slit during said deposition.

57. The method of claim 56, further comprising the step of selecting said moving to be linearly and with a constant speed.

58. The method of claim 56, further comprising the step of selecting a dynamic deposition rate of a least 30 nm*m/min.

59. The method of claim 58, thereby selecting said dynamic deposition rate to be at least 52 nm*m/min.

60. The method of claim 39, further comprising the step of adding to said reactive gas hydrogen and premixing said oxygen and hydrogen in a tank arrangement, thereby feeding said reactive gas from said tank arrangement.

61. The method of claim 39, further comprising the step of selecting total pressure adjacent said substrate to be:

0.1 to 10 mbar.

62. The method of claim 39, further comprising the step of selecting the partial pressure of said reactive gas adjacent to said substrate to be up to 10% of the total pressure.

63. The method of claim 39, further comprising the step of selecting the flow of working gas through said slit to be within a Knudsen or viscose range.

64. The method of claim 39, further comprising the step of selecting the flow F of working gas per surface area of said slit opening out and towards said substrate to be:

10 sccm/cm2≦F≦200 sccm/cm2.

65. The method of claim 39, further comprising the step of selecting the width of said slit at its end pointing towards said substrate, φ, to be: 5 mm≦φ≦40 mm.

66. The method of claim 39, further comprising the step of selecting the depth of said slit $H_s$ to be: 1 cm≦$H_s$≦20 cm.

67. The method of claim 39, further comprising the step of coating substrates of at least an extent of 100 mm×100 mm.

68. The method of claim 39, further comprising the step of coating substrates with in extent of 300 mm×400 mm.

69. The method of claim 68, further comprising the step of coating said substrates with a thickness distribution of at least ±10% with respect to a layer thickness average value.

70. The method of claim 39, further comprising the step of selecting said temperature to be 200° C.

71. The method of claim 39, further comprising the step of exploiting said targets to at least 70%.

72. The method of claim 39, further comprising the step of performing said sputtering by magnetron sputtering.

73. The method of claim 72, further comprising the step of applying a magnetic field H to said targets, so that in the middle of the said slit: 150 Gauss≦H≦1200 Gauss.

74. The method of claim 39, wherein said temperature is open looped or negative feedback controlled.

75. A method for manufacturing a display panel substrate comprising the steps of:

flowing a working gas along and out of a slit defined between two sputtering targets of Mg and towards said substrate and selecting the purity of the Mg material of said targets to be at least 99% and thereby blowing sputtered-off material out of said slit and towards said substrate;

introducing in an area between said slit and said substrate a reactive gas containing oxygen and reacting said sputtered-off material with said reactive gas, thereby depositing on said substrate an MgO layer;

setting the temperature of said substrate prevailing during said coating; and providing the possibility of introducing hydrogen gas into said reactive gas and controlling the surface roughness of said Mgo layer by controlling the amount of hydrogen gas introduced into said reactive gas.

76. A method for manufacturing a display panel substrate comprising the steps of:

flowing a working gas along and out of a slit defined between two sputtering targets of Mg and towards said substrate and selecting the purity of the Mg material of said targets to be at least 99% and thereby blowing sputtered-off material out of said slit and towards said substrate;

introducing in an area between said slit and said substrate a reactive gas containing oxygen and reacting said sputtered-off material with said reactive gas, thereby depositing on said substrate an MgO layer;

setting the temperature of said substrate prevailing during said coating; and providing the possibility of introducing hydrogen gas into said reactive gas and controlling the crystal structure of the MgO layer by controlling the amount of hydrogen gas introduced into said reactive gas.

77. A method for manufacturing a display panel substrate comprising the steps of:

flowing a working gas along and out of a slit defined between two sputtering targets of Mg and towards said substrate and selecting the purity of the Mg material of said targets to be at least 99% and thereby blowing sputtered-off material out of said slit and towards said substrate;

introducing in an area between said slit and said substrate a reactive gas containing oxygen and reacting said sputtered-off material with said reactive gas, thereby depositing on said substrate an MgO layer;

setting the temperature of said substrate prevailing during said coating; and depositing said MgO layer with a surface roughness which is homogeneously distributed along said substrate and which is in the range of 0.5 nm RMS to 18 nm RMS, measured by means of an atomic force microscopy.

78. A method for manufacturing a display panel substrate comprising the steps of:

flowing a working gas along and out of a slit defined between two sputtering targets of Mg and towards said substrate and selecting the purity of the Mg material of said targets to be at least 99% and thereby blowing sputtered-off material out of said slit and towards said substrate;

introducing in an area between said slit and said substrate a reactive gas containing oxygen and reacting said sputtered-off material with said reactive gas, thereby depositing on said substrate an MgO layer;

setting the temperature of said substrate prevailing during said coating; and adding to said reactive gas hydrogen and premixing said oxygen and hydrogen in a tank arrangement, thereby feeding said reactive gas from said tank arrangement.

79. A method for manufacturing a display panel substrate comprising the steps of:

flowing a working gas along and out of a slit defined between two sputtering targets of Mg and towards said substrate and selecting the purity of the Mg material of said targets to be at least 99% and thereby blowing sputtered-off material out of said slit and towards said substrate;

introducing in an area between said slit and said substrate a reactive gas containing oxygen and reacting said sputtered-off material with said reactive gas, thereby depositing on said substrate an MgO layer;

setting the temperature of said substrate prevailing during said coating;

coating substrates with an extent of 300 mm×400 mm;

coating said substrates with a thickness distribution of at least ±10% with respect to a layer thickness average value.

80. A method for manufacturing a display panel substrate comprising the steps of:

flowing a working gas along and out of a slit defined between two sputtering targets of Mg and towards said substrate and selecting the purity of the Mg material of said targets to be at least 99% and thereby blowing sputtered-off material out of said slit and towards said substrate;

introducing in an area between said slit and said substrate a reactive gas containing oxygen and reacting said sputtered-off material with said reactive gas, thereby depositing on said substrate an MgO layer;

setting the temperature of said substrate prevailing during said coating; and exploiting said targets to at least 70%.

* * * * *